(12) United States Patent
Ohashi et al.

(10) Patent No.: US 7,179,705 B2
(45) Date of Patent: Feb. 20, 2007

(54) FERROELECTRIC CAPACITOR AND ITS MANUFACTURING METHOD, AND FERROELECTRIC MEMORY DEVICE

(75) Inventors: Koji Ohashi, Nagano (JP); Takeshi Kijima, Nagano (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/233,264

(22) Filed: Sep. 22, 2005

(65) Prior Publication Data

US 2006/0073616 A1    Apr. 6, 2006

(30) Foreign Application Priority Data

Oct. 4, 2004  (JP) .............................. 2004-291346

(51) Int. Cl.
*H01L 21/8242*   (2006.01)

(52) U.S. Cl. ...................... 438/240; 438/393; 438/396; 438/FOR. 220; 438/FOR. 430; 257/E27.048; 257/E21.009; 257/E21.011; 257/E21.664

(58) Field of Classification Search ................ 438/240, 438/393, 396, FOR. 220, FOR. 430; 257/E27.048, 257/E21.009, E21.011, E21.664
See application file for complete search history.

(56) References Cited

U.S. PATENT DOCUMENTS

| | | | | |
|---|---|---|---|---|
| 5,206,788 A | * | 4/1993 | Larson et al. ................ | 361/313 |
| 2002/0024073 A1 | * | 2/2002 | Shimada et al. ............ | 257/295 |

FOREIGN PATENT DOCUMENTS

JP        2001-230384          8/2001

* cited by examiner

*Primary Examiner*—Michelle Estrada
(74) *Attorney, Agent, or Firm*—Harness, Dickey & Pierce, P.L.C.

(57) ABSTRACT

A method for manufacturing a ferroelectric capacitor includes successively disposing a lower electrode, at least one intermediate electrode and an upper electrode over a base substrate, and providing ferroelectric films between the electrodes, respectively. In the step of forming the intermediate electrode, (a) a first metal film is formed by a sputter method over the ferroelectric film, and (b) a second metal film is formed by a vapor deposition method over the first metal film.

8 Claims, 6 Drawing Sheets

# FERROELECTRIC CAPACITOR AND ITS MANUFACTURING METHOD, AND FERROELECTRIC MEMORY DEVICE

RELATED APPLICATIONS

This application claims priority to Japanese Patent Application No. 2004-291346 filed Oct. 4, 2004 which is hereby expressly incorporated by reference herein in its entirety.

BACKGROUND

1. Technical Field

The present invention relates to ferroelectric capacitors, methods for manufacturing the same, and ferroelectric memory devices.

2. Related Art

Ferroelectric memory devices are nonvolatile, and expected as one of the next generation type memories that have operation speeds equivalent to DRAMs. Further, they are characterized by having lower power consumption than any other memories. In order to achieve a higher integration of ferroelectric memory devices, it is known to stack a plurality of ferroelectric capacitors in layers. However, when intermediate electrodes are formed on an underlying ferroelectric film only by a conventional sputter method, the electrode film may peel off from the ferroelectric film, caused by succeeding processes. Further, there is a problem in that it is difficult to obtain desired ferroelectric characteristics in a ferroelectric film on an intermediate electrode.

It is an object of the present invention to provide a ferroelectric capacitor that has excellent ferroelectric characteristics and is difficult to have exfoliation of electrode films and a method for manufacturing the same, and ferroelectric memory devices.

SUMMARY (1) A method for manufacturing a ferroelectric capacitor in accordance with the present invention pertains to a method for manufacturing a ferroelectric capacitor wherein a lower electrode, at least one intermediate electrode and an upper electrode are successively disposed over a base substrate, and a ferroelectric film is provided between the respective electrodes, wherein, in the step of forming the intermediate electrode, (a) a first metal film is formed by a sputter method over the ferroelectric film; and (b) a second metal film is formed by a vapor deposition method over the first metal film.

According to the present invention, the first metal film is formed by a sputter method, and a second metal film is formed by a vapor deposition method. By the sputter method, generally, a film with high adhesion and excellent crystallinity can be obtained. Also, by the vapor deposition method, the energy of particles of an electrode material in a film being grown is low, and the film can be grown in an atmosphere containing few impurities, such that a clean film can be obtained, and internal stress in the formed film is low. Accordingly, as for the intermediate electrode, prevention of its exfoliation from a ferroelectric film, excellent crystallinity, and lowered impurity and internal stress can be achieved. Also, in view of the above, excellent ferroelectric characteristics can be obtained in the ferroelectric film that is formed on the intermediate electrode.

It is noted that, in the present invention, the case where B is provided above specific A includes a case where B is directly provided on A, and a case where B is provided above A through another member. This similarly applies to the inventions to be described below.

(2) In the method for manufacturing a ferroelectric capacitor, in the step (a), the first metal film may be formed by a DC sputter method.

(3) The method for manufacturing a ferroelectric capacitor may further include, after the step (a), forming an initial crystal nucleus in an island shape by a sputter method over the first metal film, wherein in the step (b), the initial crystal nucleus may be grown to thereby form the second metal film.

(4) In the method for manufacturing a ferroelectric capacitor, the initial crystal nucleus may be formed by an ion beam sputter method.

(5) In the method for manufacturing a ferroelectric capacitor, the first metal film, the initial crystal nucleus and the second metal film may be formed from an electrode material including a platinum group metal.

(6) The method for manufacturing a ferroelectric capacitor may further include forming a plurality of the intermediate electrodes, wherein the plurality of the intermediate electrodes may be formed by a common process.

(7) A ferroelectric capacitor in accordance with the present invention is manufactured by the manufacturing method described above.

(8) A ferroelectric memory device in accordance with the present invention includes the ferroelectric capacitor described above.

DETAILED DESCRIPTION

Embodiments of the present invention are described below with reference to the drawings.

First Embodiment

FIG. 1–FIG. 8 are views showing a method for manufacturing a ferroelectric capacitor in accordance with a first embodiment of the present invention.

Figure 1:
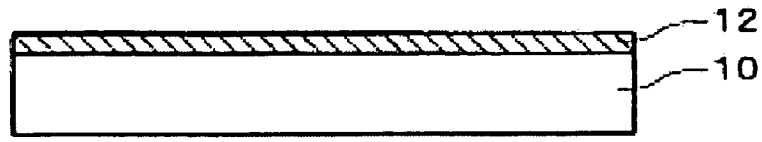
FIG. 1 is a view showing a method for manufacturing a ferroelectric capacitor in accordance with a first embodiment.

(1) First, as shown in FIG. 1, a base substrate (substrate) 10 is prepared. In the present embodiment, as the base substrate 10, a semiconductor substrate composed of an element semiconductor such as silicon, germanium or the like, or a compound semiconductor such as GaAs, ZnSe or the like, a metal substrate composed of Pt or the like, or a dielectric substrate such as a sapphire substrate, a MgO substrate, $SrTiO_3$, $BaTiO_3$, a glass substrate or the like can be used. Also, a laminate layer in which a layer such as a dielectric layer (for example, $SiO_2$, $Si_3N_4$) is laminated on the substrate in one of the various kinds can be used as the base substrate 10.

An adhesion layer 12 may be formed on the base substrate 10. As long as the adhesion layer 12 secures the adhesion strength between the base substrate 10 and a lower electrode 20 (see FIG. 4), its material is not limited. As the material, for example, a high-melting point metal such as tantalum, titanium or the like, or its oxide can be enumerated. The adhesion layer 12 may be formed by, for example, a sputter method.

Figure 2:
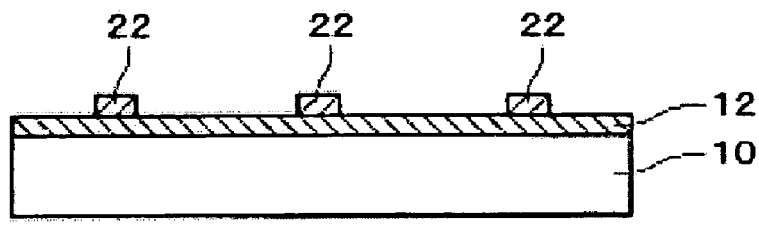
FIG. 2 is a view showing the method for manufacturing a ferroelectric capacitor in accordance with the first embodiment.
Figure 3:
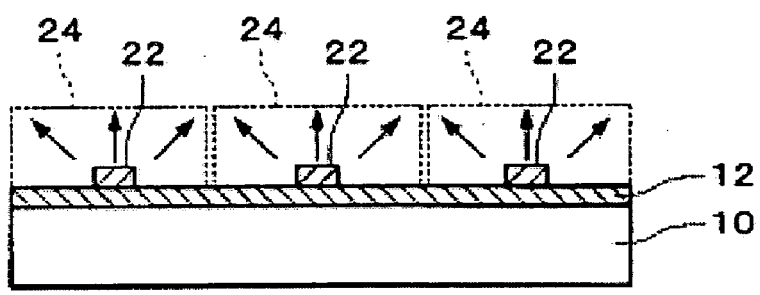
FIG. 3 is a view showing the method for manufacturing a ferroelectric capacitor in accordance with the first embodiment.
Figure 4:
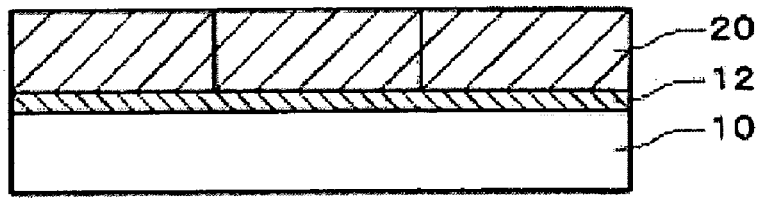
FIG. 4 is a view showing the method for manufacturing a ferroelectric capacitor in accordance with the first embodiment.

(2) Next, as shown in FIG. 2–FIG. 4, a lower electrode 20 is formed on the base substrate 10 (the adhesion layer 12). As an electrode material for the lower electrode 20, a platinum group metal such as Pt, Ir, Ru, Ni or the like can be used. The lower electrode 20 may be formed from a platinum group metal, or may be made from an alloy including a platinum group metal or its oxide.

In the example below, the lower electrode 20 is formed in plural divided stages.

(2-1) First, as shown in FIG. 2, initial crystal nucleuses 22 are formed in islands (at plural positions) on the adhesion layer 12 by a sputter method. In this instance, the temperature given to the base substrate 10 may be set to 200° C. or higher and 600° C. (or 800° C.) or lower. By this, the initial crystal nucleuses 22 can be made to have excellent crystal quality.

Here, the sputter method is a method in which ions are collided in vacuum with a target material that is a raw material, and atoms pounded out therefrom are adhered to a substrate placed adjacent thereto to form a thin film. In other words, the sputter method uses a puttering phenomenon that is a phenomenon in which a material of an electrode is pounded out from the electrode by collision of ions in electrical discharge, and is adhered to a surface of an object placed nearby. In the present embodiment, depending on differences in the method of generating ions, a RF sputter method, a DC sputter method, a magnetron sputter method, or an ion beam sputter method can be used.

Also, in the present embodiment, the initial crystal nucleuses 22 may be formed from an electrode material including two or more different kinds of platinum group metals. For example, first initial crystal nucleuses composed of a first electrode material may be formed in islands on the base substrate 10, and second initial crystal nucleuses composed of a second electrode material may be formed in islands on the first initial crystal nucleuses. When Ir is used in part of the initial crystal nucleuses 22, the fatigue characteristic of the ferroelectric capacitor can be improved because Ir has a higher diffusion preventing effect to a ferroelectric material than Pt. It is noted that each of the two or more types of initial crystal nucleuses can be formed by using a sputter method.

(2-2) Next, as shown in FIG. 3, the initial crystal nucleuses 22 are grown by a vacuum vapor deposition method, to thereby form grown layers 24. In this instance, the grown layers 24 are formed while retaining the crystallinity of the initial crystal nucleuses 22. Also, in this instance, the temperature given to the base substrate 10 may preferably be lower than the temperature for growing the initial crystal nucleuses 22, and more concretely, may be set to a temperature lower than 200° C. By this, crystal in a plate shape with few grain boundaries and excellent flatness can be grown as the grown layers 24.

It is noted that the vacuum vapor deposition method is a method in which a source material is heated and evaporated in vacuum, and then condensed on a surface of a forming body to form a thin film thereon. To give heat of vaporization to a material, an electron beam is normally used; and a source material that becomes vapor upon application of heat of vaporization radiates heat of vaporization on a surface of a forming body and is condensed thereon, whereby a thin film is formed. Also, in the vacuum vapor deposition method, the steps described above are conducted in vacuum, such that the source material can be readily vaporized, and changes in its quality by oxidation can be prevented, and the surface of the formed film can be kept clean. Also, in the vacuum vapor deposition method, flying atoms during film formation does not have such a large energy as in a sputter method, internal stress is difficult to be generated in a thin film after formation.

(2-3) In this manner, as shown in FIG. 4, lower electrodes 20 can be formed on the base substrate 10 (the adhesion layer 12). The lower electrode 20 includes the initial crystal nucleus 22 of the electrode material formed by a sputter method, and the grown layer 24 of the electrode material formed by a vapor deposition method. The film thickness of the lower electrode 20 formed in this instance may be, for example, 50–200 nm. The lower electrode 20 has an excellent crystallinity of the initial crystal nucleus 22 formed by the sputter method, few grain boundaries and flatness of the grown layer 24 formed by a vacuum vapor deposition method, and cleanliness of the surface. In other words, the lower electrode 20 with excellent crystallinity and flatness but few grain boundaries can be obtained. Also, by forming the grown layer 24 by a vacuum vapor deposition method, stress that may be present within the lower electrode 20 can be reduced, compared to the case in which the entire film growth process is conducted by a sputter method.

Also, after the lower electrode 20 has been formed by the process described above, a heat treatment may be conducted, such that stress present within the lower electrode 20 can be released. It is noted that such a heat treatment may be conducted in a non-oxidizing gas atmosphere such as nitrogen, argon or the like, whereby oxidation of the electrode film surface can be prevented. However, when the lower electrode 20 is formed by the method described above, its excellent quality can be retained even when such a heat treatment is omitted.

Also, in the present embodiment, by repeating the above-described steps (2-1) and (2-2), the lower electrode 20 composed of a plurality of layers can be formed. According to the above, by laminating electrode films with few grain boundaries in multiple layers, when another crystal layer is formed on the electrode film, a constituting element of the other crystal layer diffuses into the electrode film through its grain boundaries, such that deterioration of the quality of the other crystal layer can be prevented. More specifically, by forming initial crystal nucleuses in the second stage and later on gaps among grain boundaries of the grown layer of the electrode material, the lower electrode 20 composed of multiple layers with few grain boundaries can be formed.

Also, in the present embodiment, a diffusion prevention film (not shown) may be formed. As the electrode material for the diffusion prevention film, Ir, $IrO_2$, Ru, $RuO_2$, $HfO_2$, $Al_2O_3$ or the like may be enumerated, and may be composed of a material different from that of the initial crystal nucleus 22, for example. The diffusion prevention film can be formed by using, for example, a sputter method. The diffusion prevention film may be formed between the initial crystal nucleus 22 and the grown layer 24. Alternatively, when grown layers 24 in multiple layers are laminated on the initial crystal nucleus 22, diffusion prevention films may be formed between the grown layers 24, respectively. The diffusion prevention film is formed in a manner to embed gaps among grain boundaries of the grown layer 24. By this, the diffusion prevention effect with respect to the ferroelectric material can be improved, and the fatigue characteristic of the ferroelectric capacitor can be improved.

Figure 5:
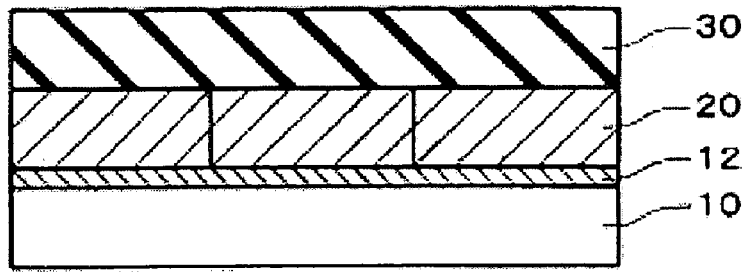
FIG. 5 is a view showing the method for manufacturing a ferroelectric capacitor in accordance with the first embodiment.

(3) Next, as shown in FIG. 5, a ferroelectric film 30 is formed on the lower electrodes 20. The ferroelectric film 30 can be formed by using a PZT system ferroelectric composed of oxides including Pb, Zr and Ti as constituent elements. Alternatively, Pb (Zr, Ti, Nb) $O_3$ (PZTN system) in which Nb is doped in the Ti site may be applied. Alternatively, the ferroelectric film is not limited to these materials, but for example, any of a SBT system, a BST system, a BIT system and a BLT system may be applied. As the method for forming the ferroelectric film, a solution coating method (including a sol-gel method, a MOD (Metal Organic Decomposition) method or the like), a sputter method, a CVD (Chemical Vapor Deposition) method, a MOCVD (Metal Organic Chemical Vapor Deposition) method or the like can be applied.

Figure 6:
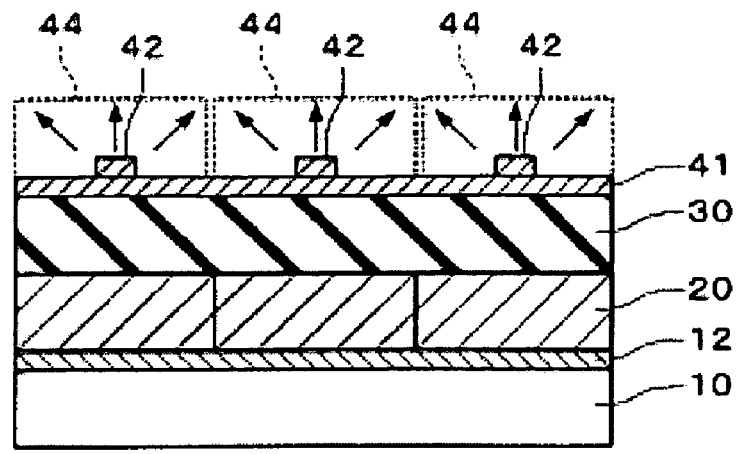
FIG. 6 is a view showing the method for manufacturing a ferroelectric capacitor in accordance with the first embodiment.
Figure 7:
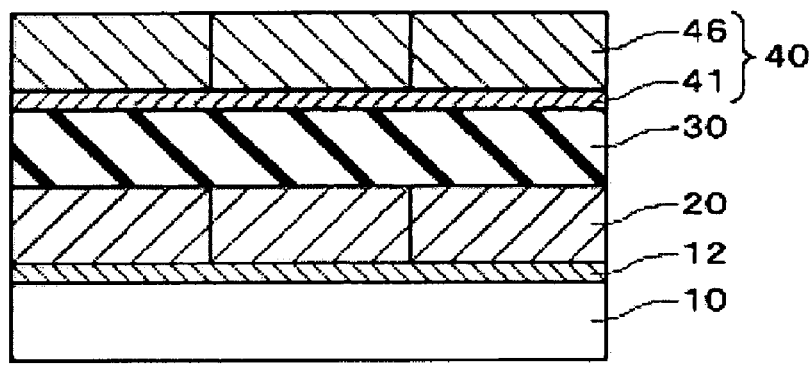
FIG. 7 is a view showing the method for manufacturing a ferroelectric capacitor in accordance with the first embodiment.

(4) Next, as shown in FIG. 6 and FIG. 7, intermediate electrodes 40 are formed on the ferroelectric film 30. The intermediate electrode 40 refers to an electrode that is provided between the lower electrode 20 and an upper electrode 60 (see FIG. 8) to be described below. The electrode material for the intermediate electrode 40 may be similar to that of the lower electrode 20, and one including a platinum group metal can be used.

(4-1) First, as shown in FIG. 6, a first metal film 41 is formed on the ferroelectric film 30 by a sputter method. The first metal film 41 can be formed by, for example, a DC sputter method. By this, the first metal film 41 can be formed from particles of an electrode material with high energy, such that adhesion and crystallinity of the intermediate electrode 40 can be improved. The first metal film 41 may be formed by a method for generating particles with the highest energy among films composing the intermediate electrode 40.

(4-2) Next, as shown in FIG. 6, initial crystal nucleuses 42 are formed in islands (at plural positions) on the first metal film 41 by a sputter method. The initial crystal nucleuses 42 may be formed by, for example, an ion beam sputter method. The temperature applied to the base substrate 10 in the step of forming the initial crystal nucleuses 42 may be set to 200° C. or higher and 600° C. (or 800° C.) or lower. By this, the initial crystal nucleuses can be made to have an excellent crystal quality. The initial crystal nucleuses 42 may be formed by a method for generating particles with a lower energy than that of the first metal film 41. It is noted that, in the intermediate electrode 40, the initial crystal nucleus 42 may also be formed from, for example, electrode materials including two or more types of different platinum group metals, in a manner similar to the contents described in conjunction with the lower electrode 20.

(4-3) Next, the initial crystal nucleuses 42 are grown by a vacuum vapor deposition method, thereby forming grown layers 44. At this time, the growth layers 44 are formed while retaining the crystallinity of the initial crystal nucleuses 42. Also, in this instance, the temperature applied to the base substrate 10 may preferably be lower than the temperature for forming the initial crystal nucleuses 42, and more concretely, may be set to a temperature lower than 200° C. By this, crystal in a plate shape with few grain boundaries and excellent flatness can be formed as the grown layers 44.

(4-4) In this manner, as shown in FIG. 7, second metal films 46 can be formed on the first metal films 41. The intermediate electrode 40 includes the first metal film 41 of the electrode material that is formed by the sputter method, and the second metal film 46 of the electrode material that is formed by a combination of the sputter method and the vapor deposition method. The film thickness of the intermediate electrode 40 formed in this instance may be, for example, 50–200 nm. The intermediate electrode 40 has an excellent crystallinity of the initial crystal nucleuses formed by a sputter method, few grain boundaries and flatness of the grown layers 44 formed by a vacuum vapor deposition method, and cleanliness of the surface. In other words, the intermediate electrode 40 with an excellent crystallinity and flatness and few grain boundaries can be obtained. Also, by forming the grown layers 44 by a vacuum vapor deposition method, stress that is present within the intermediate electrode 40 can be reduced, compared to the case where the entire film forming process is conducted by a sputter method.

Also, after the intermediate electrode 40 has been formed by the process described above, a heat treatment may be conducted, such that stress present within the intermediate electrode 40 can be released. It is noted that such a heat treatment may be conducted in a non-oxidizing gas atmosphere such as nitrogen, argon or the like, such that oxidation of the electrode film surface can be prevented. However, when the intermediate electrode 40 is formed by the method described above, its excellent quality can be retained even when such a heat treatment is omitted.

Also, in the present embodiment, by repeating the above-described steps (4-2) and (4-3), the intermediate electrode 40 composed of a plurality of layers can be formed. The details of the lower electrode 20 may be referred to for the effects obtained by this method.

Also, in the present embodiment, a diffusion prevention film (not shown) may not be formed, and for details thereof, the contents of the lower electrode 20 may also be referred to.

Figure 8:
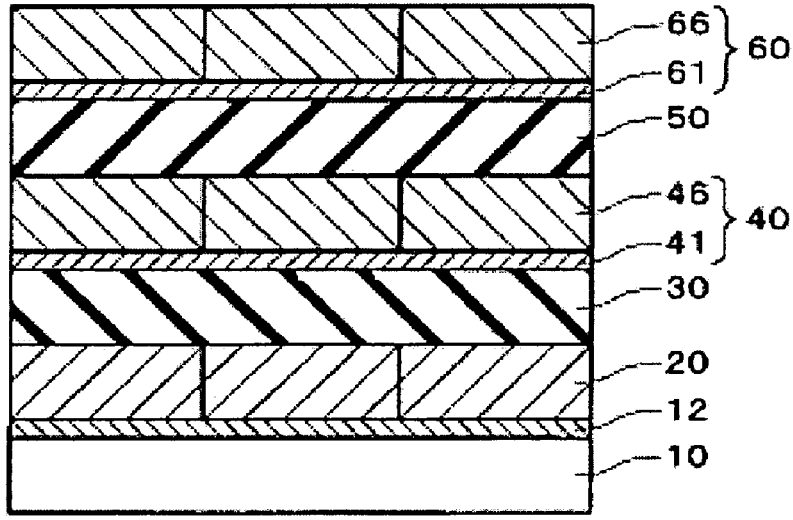
FIG. 8 is a view showing the method for manufacturing a ferroelectric capacitor in accordance with the first embodiment.

(5) Next, as shown in FIG. 8, a ferroelectric film 50 is formed on the intermediate electrode 40, and upper electrodes 60 are formed on the ferroelectric film 50. For the details of the ferroelectric film 50, the contents of the ferroelectric film 30 that is provided between the lower electrode 20 and the intermediate electrode 40 can be applied. Also, the upper electrode 60 can be formed from an electrode material and by a method which are similar to those of the intermediate electrode 40, and may have a laminated structure of first and second metal films 61 and 66. It is noted that an unshown oxide film or the like is provided on the upper electrode 60.

(6) In this manner, a multilayer type ferroelectric capacitor 1 can be manufactured on the base substrate 10. The ferroelectric capacitor 1 has the lower electrode 20, the intermediate electrode 40 and the upper electrode 60 successively disposed, and the ferroelectric films 30 and 50 are provided between the electrodes, respectively. In the example shown in FIG. 8, a first ferroelectric capacitor is formed from the lower electrode 20, the ferroelectric film 30 and the intermediate electrode 40, and a second ferroelectric capacitor is formed from the intermediate electrode 40, the ferroelectric film 50 and the upper electrode 60. The intermediate electrode 40 serves as a common electrode for the first and second ferroelectric capacitors.

In accordance with the present embodiment, during the step of forming the intermediate electrode 40, the first metal film 41 is formed by a sputter method, and the second metal film 46 is formed by a combination of a sputter method and a vapor deposition method. By the sputter method, generally, a film with high adhesion and excellent crystallinity can be obtained. Further, by the vapor deposition method, the energy of particles of an electrode material in a film being grown is low, and the film can be grown in an atmosphere containing few impurities, such that a clean film can be obtained, and internal stress in the formed film is low. Accordingly, as for the intermediate electrode 40, prevention of its exfoliation from the ferroelectric films 30 and 50, excellent crystallinity, and lowered impurity and internal stress can be achieved. Also, in view of the above, excellent ferroelectric characteristics can be obtained in the ferroelectric film 50 that is formed on the intermediate electrode 40.

Furthermore, according to the present embodiment, interlayer dielectric layers (for example, $SiO_2$ layers) do not have to be formed between ferroelectric capacitors in a multilayer type, such that the cost can be reduced, and the process can be simplified.

In the example described above, the description is made as to an example in which the lower electrode 20 or the upper electrode 60 is formed in plural divided stages, but the present embodiment is not limited to the above. For example, the lower electrode 20 (or the upper electrode 60) may be formed only by a sputter method or a vapor deposition method.

Figure 9:
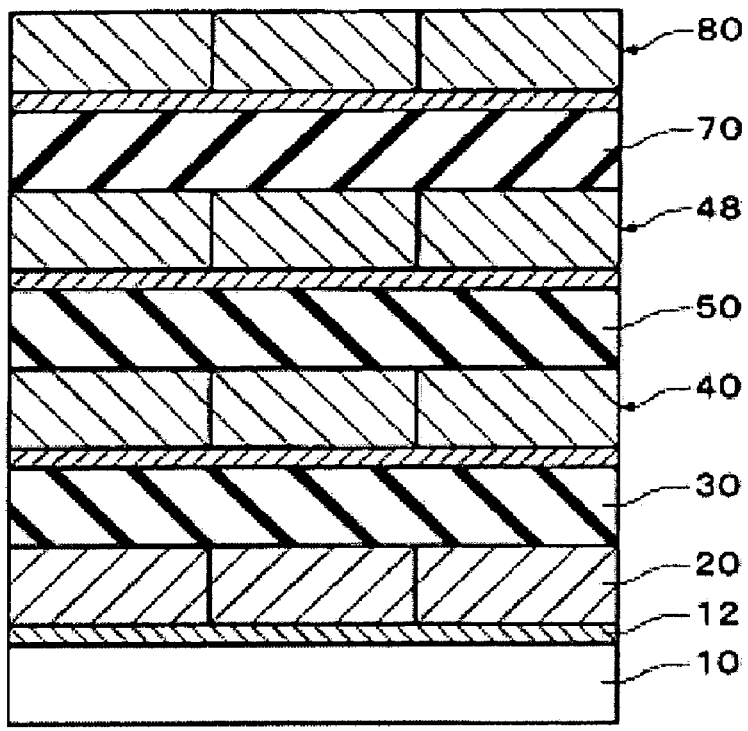
FIG. 9 is a view showing a modified example of the first embodiment.

As a modified example of the present embodiment, a plurality of intermediate electrodes 40 and 48 can be formed, as shown in FIG. 9. In other words, ferroelectric capacitors in three or more layers can be laminated. More specifically, a ferroelectric capacitor 3 has a lower electrode 20, a plurality of intermediate electrodes 40 and 48, and an upper electrode 80 successively disposed, wherein ferroelectric films 30, 50 and 70 are provided between the electrodes, respectively. In the case of this modified example, the plurality of intermediate electrodes 40 and 48 may be formed by the same process. Accordingly, as for the respective intermediate electrodes 40 and 48, prevention of their exfoliation from the ferroelectric films 30, 50 and 70, excellent crystallinity, and lowered impurity and internal stress can be achieved.

Next, a detailed embodiment example in accordance with the present embodiment is described.

Embodiment Example

In the present embodiment example, the ferroelectric capacitor described above was manufactured, and its ferroelectric characteristics were examined. First, the sample is described.

A base substrate 10 in which a silicon thermal oxidation film was formed as an interlayer dielectric layer on a surface of a silicon substrate was used. Also, a $TiO_X$ film was formed as an adhesion layer 12 by a sputter method on the surface of the base substrate 10.

In the step of forming a lower electrode 20, first, a Pt initial crystal nucleus 22 was formed to a thickness of 40 nm or greater by an ion beam sputter method at a base substrate temperature of 800° C. or below. Then, an Ir diffusion prevention film was formed by an ion beam sputter method to a thickness of 10 nm or less at room temperature. Then, a Pt grown layer 24 was formed by a vapor deposition method to a thickness of 100 nm or greater at a base substrate temperature of 200° C. or below. It is noted that the Ir diffusion prevention film was provided to improve the fatigue characteristic of the ferroelectric capacitor, as described above.

Next, a ferroelectric film 30 was formed on the lower electrode 20. More specifically, first, a series of steps including a mixed solution coating step (by a spin coat method), an alcohol removal step, a dry thermal treatment step, and a cleaning thermal treatment step (at 150° C. in the first time and at 300° C. in the second time) were repeated a desired number of times. Then, sintering was conducted at 650° C. by crystallization annealing to form a ferroelectric film. In the present embodiment example, the ferroelectric film having a composition of Pb ($Zr_{0.17}$ $Ti_{0.66}$ $Nb_{0.17}$) $O_3$ was formed.

Then, in the step of forming an intermediate electrode 40, first, a first metal layer 41 composed of Pt was formed by a DC sputter method to a thickness of 40 nm or greater at a base substrate temperature of 800° C. or below. Then, a Pt initial crystal nucleus 42, an Ir diffusion prevention film and a Pt grown layer 44 were formed under conditions similar to those applied to the lower electrode 20.

Then, a ferroelectric film 50 was formed on the intermediate electrode 40 under conditions similar to those applied to the ferroelectric film 30, and then an upper electrode 60 was formed on the ferroelectric film 50 under conditions similar to those applied to the intermediate electrode 40.

Figure 10:
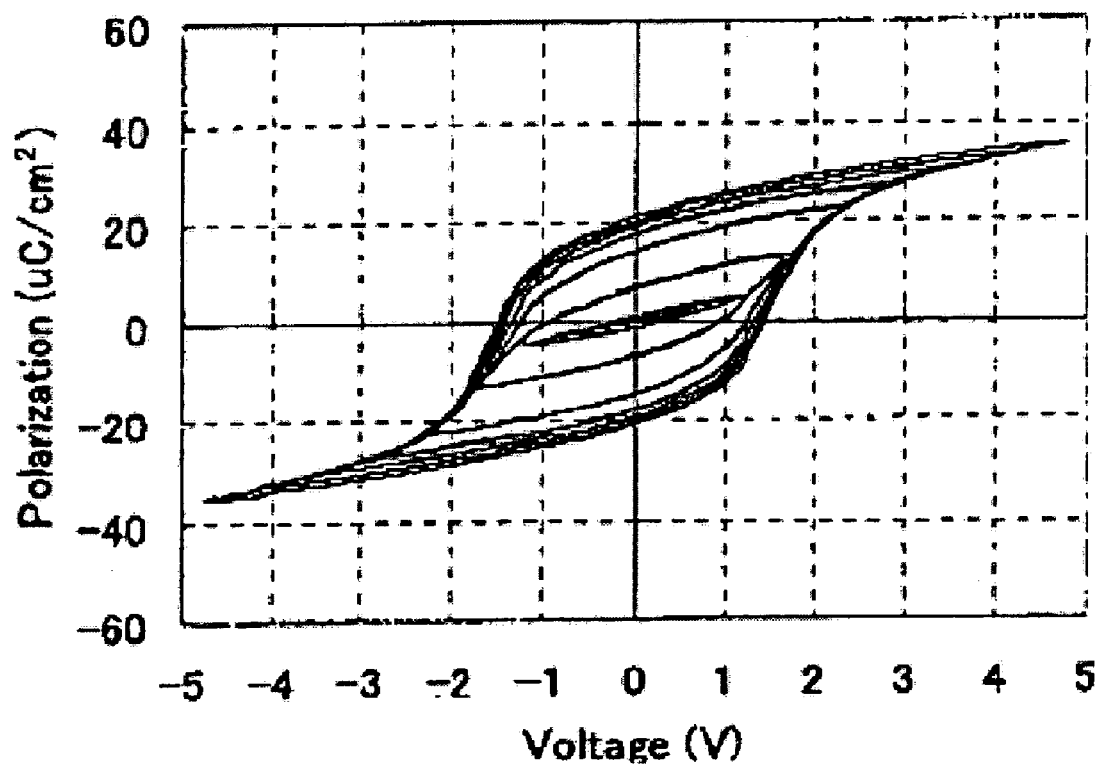
FIG. 10 is a graph showing ferroelectric characteristics concerning an embodiment example of the first embodiment.
Figure 11:
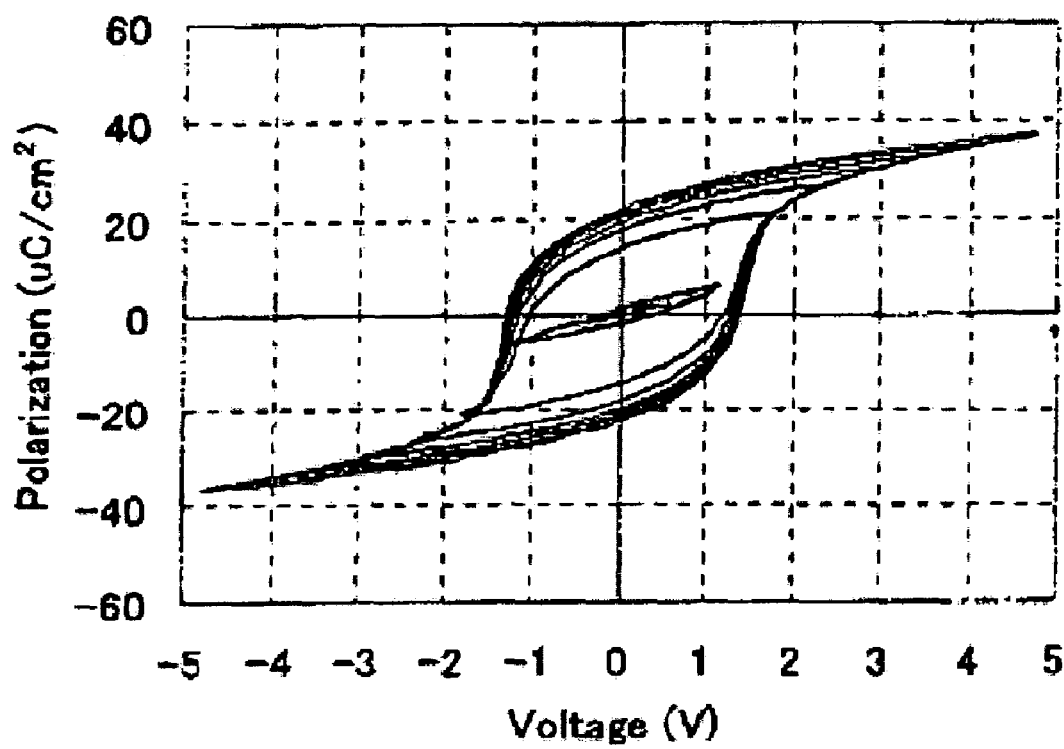
FIG. 11 is a graph showing ferroelectric characteristics concerning an embodiment example of the first embodiment.

Ferroelectric characteristics of the ferroelectric films 30 and 50 were measured for the sample of ferroelectric capacitor thus obtained. FIG. 10 is a graph showing hysteresis characteristics of the ferroelectric film between the lower electrode and the intermediate electrode, and FIG. 11 is a graph showing hysteresis characteristics of the ferroelectric film between the intermediate electrode and the upper electrode. It is noted that the characteristics shown in FIG. 10 were measured in a state before the ferroelectric film 50 was formed on the intermediate electrode 40.

It is understood from the above that the hysteresis characteristics in both FIG. 10 and FIG. 11 exhibit ferroelectric characteristics with excellent squareness. This is believed to have happed because the crystallinity and orientation of an underlying electrode (the lower electrode 20 or the intermediate electrode 40) are excellent.

Second Embodiment

Figure 12:
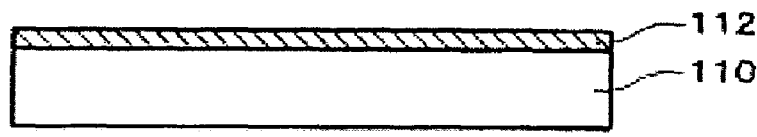
FIG. 12 is a view showing a method for manufacturing a ferroelectric capacitor in accordance with a second embodiment.
Figure 13:
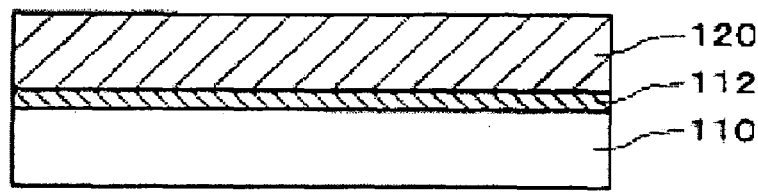
FIG. 13 is a view showing the method for manufacturing a ferroelectric capacitor in accordance with the second embodiment.
Figure 14:
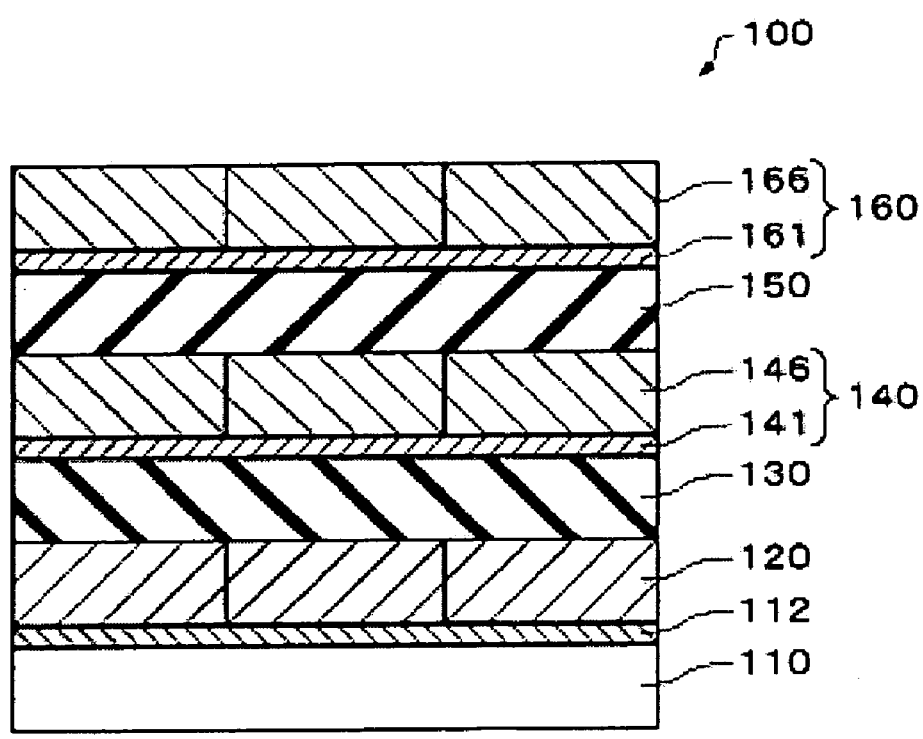
FIG. 14 is a view showing the method for manufacturing a ferroelectric capacitor in accordance with the second embodiment.

FIG. 12–FIG. 14 are views showing a method for manufacturing a ferroelectric capacitor in accordance with a second embodiment of the present invention. It is noted that the present embodiment includes contents that can be derived from the first embodiment.

(1) As shown in FIG. 12, a base substrate (substrate) 110 is prepared. Also, an adhesion layer 112 may be formed on the base substrate 110. Details thereof are the same as those described above.

(2) Next, as shown in FIG. 12, a lower electrode 120 is formed on the base substrate 110 (the adhesion layer 112). The lower electrode 120 may be formed by a sputter method, may be formed by a vapor deposition method, or may be formed from an initial crystal nucleus and a grown layer described in the first embodiment. Also, the details described above can be applied to the electrode material for the lower electrode 120.

(3) Next, as shown in FIG. 13, a ferroelectric film 130 is formed on the lower electrode 120. Details of the ferroelectric film 130 are also the same as those described above.

(4) Then, an intermediate electrode 140 is formed on the ferroelectric film 130. In the present embodiment, the step of forming the intermediate electrode 140 is different from the first embodiment.

In the present embodiment, initially, a first metal film 141 is formed on the ferroelectric film 130 by a sputter method. The first metal film 141 can be formed by, for example, a DC sputter method. By this, the first metal film 141 can be formed from particles of an electrode material with a high energy, such that adhesion and crystallinity of the intermediate electrode 140 can be improved. Also, while the first metal film 141 is formed, the base substrate (substrate) may be heated at a temperature of, for example, 800° C. or below, whereby adhesion and crystallinity of the intermediate electrode 140 can be improved. Furthermore, after the first metal film 141 has been formed, the base substrate (substrate) may be heated at a temperature of, for example, 800° C. or below, whereby adhesion and crystallinity of the intermediate electrode 140 can be improved. It is noted that the atmosphere during the heat treatment may be either oxidizing or non-oxidizing.

Next, a second metal film 146 is formed on the first metal film 141 by a vacuum vapor deposition method. In other words, in the present embodiment, formation of initial crystal nucleuses is omitted. By so doing, the process can be simplified and the cost can be lowered. It is noted that an Ir diffusion prevention film may be or may not he included between the first metal film 141 and the second metal film 146.

After the intermediate electrode 140 has been formed in this manner, a heat treatment may be conducted to release stress that may be present within the intermediate electrode 140. It is noted that the atmosphere during the heat treatment may be either oxidizing or non-oxidizing. In the present embodiment, such a heat treatment is conducted to achieve an excellent quality in the intermediate electrode 140.

(5) Then, a ferroelectric film 150 is formed on the intermediate electrode 140, and an upper electrode 160 is formed on the ferroelectric film 150. The upper electrode 160 can be formed from an electrode material and by a method which are similar to those of the intermediate electrode 140, and may have a laminated structure of first and second metal films 161 and 164.

(6) In this manner, a multilayer type ferroelectric capacitor 100 can be manufactured on the base substrate 110. The ferroelectric capacitor 100 has the lower electrode 120, the intermediate electrode 140 and the upper electrode 160 successively disposed, and the ferroelectric films 130 and 150 are provided between the electrodes, respectively. In the example shown in FIG. 14, a first ferroelectric capacitor is formed from the lower electrode 120, the ferroelectric film 130 and the intermediate electrode 140, and a second ferroelectric capacitor is formed from the intermediate electrode 140, the ferroelectric film 150 and the upper electrode 160. The intermediate electrode 140 serves as a common electrode for the first and second ferroelectric capacitors.

In accordance with the present embodiment, during the step of forming the intermediate electrode 140, the first metal film 141 is formed by a sputter method, and the second metal film 146 is formed by a vapor deposition method. By the sputter method, generally, a film with high adhesion and excellent crystallinity can be obtained. Further, by the vapor deposition method, the energy of particles of an electrode material in a film being grown is low, and the film can be grown in an atmosphere containing few impurities, such that a clean film can be obtained, and internal stress in the formed film is low. Accordingly, as for the intermediate electrode 140, prevention of its exfoliation from the ferroelectric films 130 and 150, excellent crystallinity, and lowered impurity and internal stress can be achieved. Also, in view of the above, excellent ferroelectric characteristics can be obtained in the ferroelectric film 150 that is formed on the intermediate electrode 140.

Third Embodiment

Figure 15:
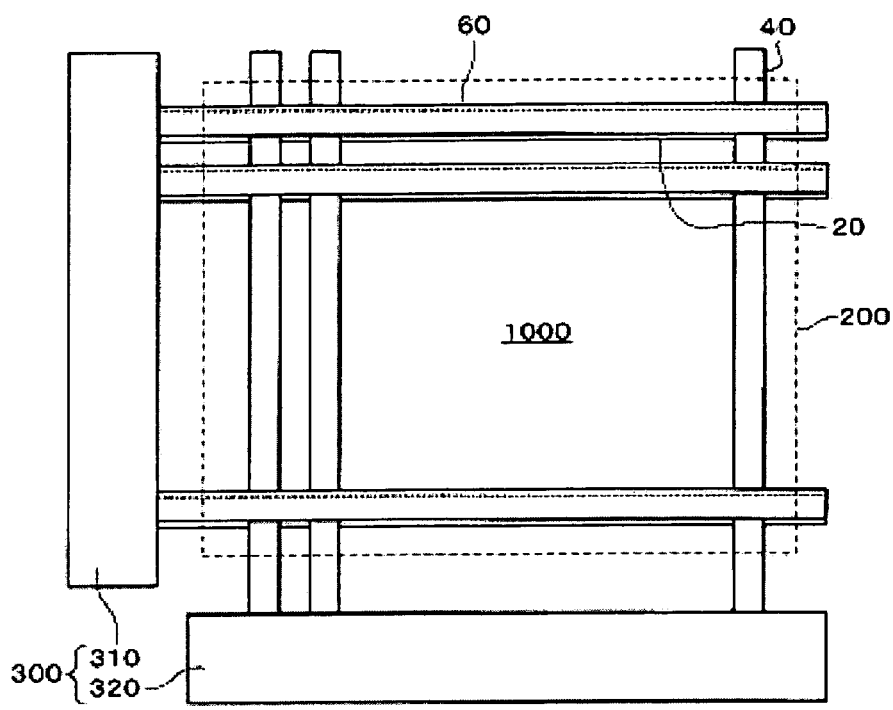
FIG. 15 (A) and FIG. 15 (B) are views showing a ferroelectric memory device in accordance with a third embodiment.
Figure 15:
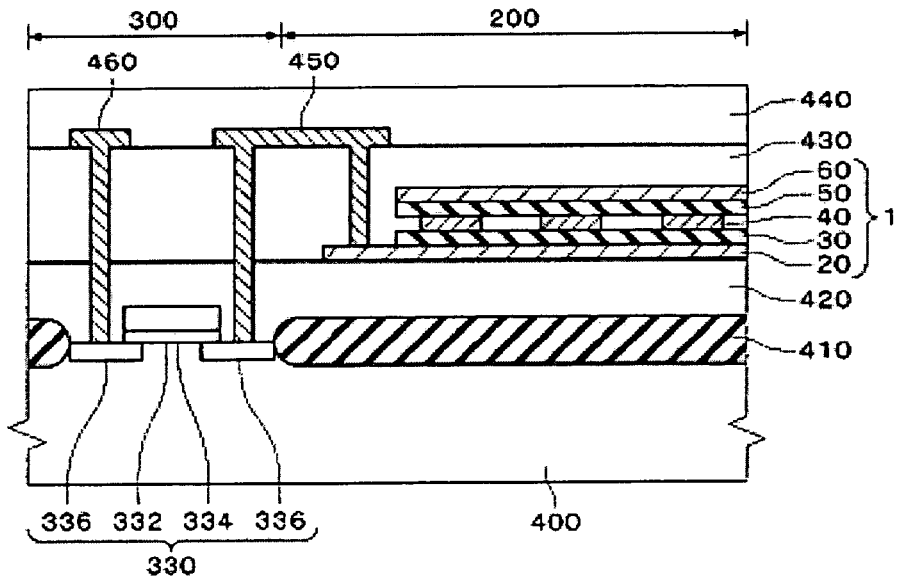

In the present embodiment, a ferroelectric memory device including the ferroelectric capacitor described above is described. FIG. 15 (A) is a plan view of a ferroelectric memory device in accordance with the present embodiment, and FIG. 15 (B) is a cross-sectional view of the ferroelectric memory device in accordance with the present embodiment.

The ferroelectric memory device 1000 has a ferroelectric memory cell array 200 and a peripheral circuit section 300, as shown in FIG. 15 (A). The ferroelectric memory cell array 200 and the peripheral circuit section 300 are formed in different layers, respectively. The peripheral circuit section 300 is formed in an area different from the ferroelectric memory cell array 200 on a semiconductor substrate 400. As a concrete example of the peripheral circuit section 300, a Y-gate, a sense amplifier, an I/O buffer, an X-address decoder, a Y-address decoder, and an address buffer can be enumerated.

The ferroelectric memory cell array 200 includes lower electrodes 20 (first word lines) for selection of rows, intermediate electrodes 40 (bit lines) for selection of columns, and upper electrodes 60 (second word lines) for selection of rows, which are disposed orthogonal to one another. Also, the lower electrodes 20, the intermediate electrodes 40 and the upper electrodes 60 have stripe configurations formed from signal electrodes in multiple lines.

Further, as shown in FIG. 15 (B), a ferroelectric film 30 is provided between the lower electrode 20 and the intermediate electrode 40, and a ferroelectric film 50 is provided between the intermediate electrode 40 and the upper electrode 60. In the ferroelectric memory cell array 200, a memory cell that functions as the ferroelectric capacitor 1 is formed in an area where the lower electrode 20 and the intermediate electrode 40 intersect each other (or an area where the intermediate electrode 40 and the upper electrode 60 intersect each other). Because this memory cell uses a multilayer type structure of ferroelectric capacitors, a highly integrated and miniaturized ferroelectric memory device can be provided. The ferroelectric films 30 and 50 serve well if they are disposed in areas where at least electrodes intersect one another.

Furthermore, the ferroelectric memory device 1000 has a second interlayer dielectric film 430 that is formed in a manner to cover the ferroelectric capacitor 1. Further, an insulating protection layer 440 is formed over the second interlayer dielectric film 430 in a manner to cover wiring layers 450 and 460.

The peripheral circuit section 300 includes a variety of circuits for selectively writing or reading information with respect to the ferroelectric memory cell array 200, as indicated in FIG. 15 (A), and may be composed of, for example, a first drive circuit 310 for selectively controlling the lower electrode 20 and the upper electrode 60, a second drive circuit 320 for selectively controlling the intermediate electrode 40, and other signal detection circuits (illustration thereof omitted) such as a sense amplifier and the like.

Also, the peripheral circuit 300 includes MOS transistors 330 formed on the semiconductor substrate 400, as shown in FIG. 15 (B). The MOS transistor 330 has a gate dielectric film 332, a gate electrode 334, and source/drain regions 336. The MOS transistors 330 are isolated from one another by element isolation areas 410. A first interlayer dielectric film 420 is formed over the semiconductor substrate 400 on which the MOS transistors 330 are formed. Further, the peripheral circuit section 300 and the ferroelectric memory cell array 200 are electrically connected to one another by the wiring layer 450.

According to the present embodiment, the ferroelectric memory device 1000 includes the ferroelectric capacitor 1 manufactured by the method described above, such that the electrode films can be prevented from peeling off, and excellent ferroelectric characteristics can be obtained. Also, because the ferroelectric capacitor 1 uses a multilayer type structure, higher integration and miniaturization of memories can be achieved.

The present invention is not limited to the embodiments described above, and many modifications can be made. For example, the present invention may include compositions that are substantially the same as the compositions described in the embodiments (for example, a composition with the same function, method and result, or a composition with the same objects and results). Also, the present invention includes compositions in which portions not essential in the compositions described in the embodiments are replaced with others. Also, the present invention includes compositions that achieve the same functions and effects or achieve the same objects of those of the compositions described in the embodiments. Furthermore, the present invention includes compositions that include publicly known technology added to the compositions described in the embodiments.

What is claimed is:

1. A method for manufacturing a ferroelectric capacitor wherein a lower electrode, at least one intermediate electrode and an upper electrode are successively disposed over a base substrate, and a ferroelectric film is provided between the respective electrodes, the method for manufacturing a ferroelectric capacitor wherein, in the step of forming the intermediate electrode,
   (a) a first metal film is formed by a sputter method over the ferroelectric film; and
   (b) a second metal film is formed by a vapor deposition method directly in contact with the first metal film.

2. In the method for manufacturing a ferroelectric capacitor according to claim 1, the method for manufacturing a ferroelectric capacitor wherein, in the step (a), the first metal film is formed by a DC sputter method.

3. In the method for manufacturing a ferroelectric capacitor according to claim 1, the method for manufacturing a ferroelectric capacitor further including:
   after the step (a), forming an initial crystal nucleus in an island shape by a sputter method over the first metal film, wherein
   in the step (b), the initial crystal nucleus is grown to thereby form the second metal film.

4. In the method for manufacturing a ferroelectric capacitor according to claim 3, the method for manufacturing a ferroelectric capacitor wherein the initial crystal nucleus is formed by an ion beam sputter method.

5. In the method for manufacturing a ferroelectric capacitor according to claim 3, the method for manufacturing a ferroelectric capacitor wherein the first metal film, the initial crystal nucleus and the second metal film are formed from an electrode material including a platinum group metal.

6. In method for manufacturing a ferroelectric capacitor according to claim 1, the method for manufacturing a ferroelectric capacitor further including forming a plurality of the intermediate electrodes, wherein the plurality of the intermediate electrodes are formed by a common process.

7. A ferroelectric capacitor manufactured by the manufacturing method recited in claim 1.

8. A ferroelectric memory device including the ferroelectric capacitor recited in claim 7.

* * * * *